(12) United States Patent
Khosla

(10) Patent No.: US 9,506,160 B2
(45) Date of Patent: Nov. 29, 2016

(54) DUAL ANODIZED COATING

(71) Applicant: Apple Inc., Cupertino, CA (US)

(72) Inventor: Jivan K. Khosla, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 54 days.

(21) Appl. No.: 14/454,088

(22) Filed: Aug. 7, 2014

(65) Prior Publication Data
US 2014/0346049 A1 Nov. 27, 2014

Related U.S. Application Data

(63) Continuation of application No. 13/766,410, filed on Feb. 13, 2013, now Pat. No. 8,828,553, which is a continuation of application No. 12/692,433, filed on Jan. 22, 2010, now Pat. No. 8,398,841.

(60) Provisional application No. 61/228,420, filed on Jul. 24, 2009.

(51) Int. Cl.
| | | |
|---|---|---|
| *C25D 11/02* | (2006.01) | |
| *H05K 5/02* | (2006.01) | |
| *H05K 5/04* | (2006.01) | |
| *C25D 5/02* | (2006.01) | |
| *C25D 11/12* | (2006.01) | |
| *C25D 7/10* | (2006.01) | |
| *C25D 11/22* | (2006.01) | |
| *C25D 11/24* | (2006.01) | |

(52) U.S. Cl.
CPC .............. *C25D 11/022* (2013.01); *C25D 5/02* (2013.01); *C25D 11/12* (2013.01); *H05K 5/0243* (2013.01); *H05K 5/04* (2013.01); *C25D 7/10* (2013.01); *C25D 11/22* (2013.01); *C25D 11/243* (2013.01); *C25D 11/246* (2013.01); *Y10T 428/257* (2015.01)

(58) Field of Classification Search
None
See application file for complete search history.

(56) References Cited

U.S. PATENT DOCUMENTS

| | | | | |
|---|---|---|---|---|
| 2,691,627 A | * | 10/1954 | Johnson | ............... B44C 1/04 205/121 |
| 2005/0221712 A1 | * | 10/2005 | Yasui | ............... H01J 9/025 445/50 |

FOREIGN PATENT DOCUMENTS

JP       2006097125 A   *   4/2006

OTHER PUBLICATIONS

CPC Handbook of Materials Science and Engineering, 2001, p. 1639-1640.*
JP 2006-097125A_MT Apr. 13, 2006.*
"Anodizing." Wikipedia, The Free Encyclopedia. Wikimedia Foundation, Inc., Last Updated Jun. 8, 2016. Web. https://en.wikipedia.org/wiki/Anodizing.

* cited by examiner

*Primary Examiner* — Vera Katz
(74) *Attorney, Agent, or Firm* — Downey Brand LLP

(57) ABSTRACT

A metal surface treated to have two anodized layers or regions may be used in electronic devices. The surface treatment may include performing a first anodization process to create a first anodized layer, removing the first anodized layer at select locations, and performing a second anodization process to create a second anodized layer at the select locations. The first and second anodized regions may have different decorative properties, such as color, and different structural properties, such as degree of abrasion resistance. One of the anodization processes may be hard anodization and the other may be standard anodization.

10 Claims, 7 Drawing Sheets

DUAL ANODIZED COATING

CROSS REFERENCE TO RELATED APPLICATIONS

This is a continuation of U.S. patent application Ser. No. 13/766,410 filed Feb. 13, 2013, entitled "Dual Anodization Surface Treatment," now U.S. Pat. No. 8,828,553, issued Sep. 9, 2014, which is a continuation of U.S. patent application Ser. No. 12/692,433, filed Jan. 22, 2010 entitled "Dual Anodization Surface Treatment", now U.S. Pat. No. 8,398,841 issued Mar. 19, 2013, which claims priority to U.S. Provisional Application No. 61/228,420, filed Jul. 24, 2009, each of which are incorporated herein by reference in its entirety.

FIELD

The present invention relates to treatments for a surface of an article and an article with a treated surface. More particularly, the present invention relates to performing dual anodization treatments to the surface of a metal article and a metal article with a surface having two distinct anodized layers or regions.

BACKGROUND

Many products in the commercial and consumer industries are metal articles, or contain metal parts. The metal surfaces of these products may be treated by any number of processes to alter the surface to create a desired effect, either functional, cosmetic, or both. One example of such a surface treatment is anodization. Anodizing a metal surface converts a portion of the metal surface into a metal oxide, thereby creating a metal oxide layer. Anodized metal surfaces provide increased corrosion resistance and wear resistance. Such characteristics are important to consumers because they want to purchase products that have surfaces that will stand up to normal wear and tear of everyday use and continue to look brand new. Anodized metal surfaces may also be used in obtaining a cosmetic effect, such as utilizing the porous nature of the metal oxide layer created by anodization for absorbing dyes to impart a color to the anodized metal surface. Accordingly, there is a continuing need for new surface treatments, or combination of surface treatments, for metal surfaces to create products that will protect the appearance of the metal surface while also achieving a desired aesthetic appearance.

SUMMARY

A surface of a metal part or article may be treated to create dual anodized layers or regions having different properties. The two anodized layers may be different colors or may have different degrees of scratch or abrasion resistance. One anodized layer may be decorative in nature and the other anodized layer may be structural in nature. The dual anodized layers or regions may be applied to a broad range of metal articles including, electronic components, household appliances and cookware, automotive parts, and athletic equipment.

In broad terms, the dual anodized layers or regions are created by performing a first anodization process on the surface of a metal part or article to create a first anodized layer, removing the first anodized layer at select locations, and performing a second anodization process to create a second anodized layer at the select locations. One of the first and second anodization processes may be a hard anodization process to create a hard anodized layer or region and the other of the first and second anodization processes may be a standard anodization process to create a standard anodized layer or region.

BRIEF DESCRIPTION OF THE DRAWINGS

The accompanying drawings, which are incorporated herein and form a part of the specification, illustrate the present invention by way of example, and not by way of limitation. The drawings together with the description, further serve to explain the principles of the invention and to enable a person skilled in the pertinent art to make and use the invention.

DETAILED DESCRIPTION

Figure 1:
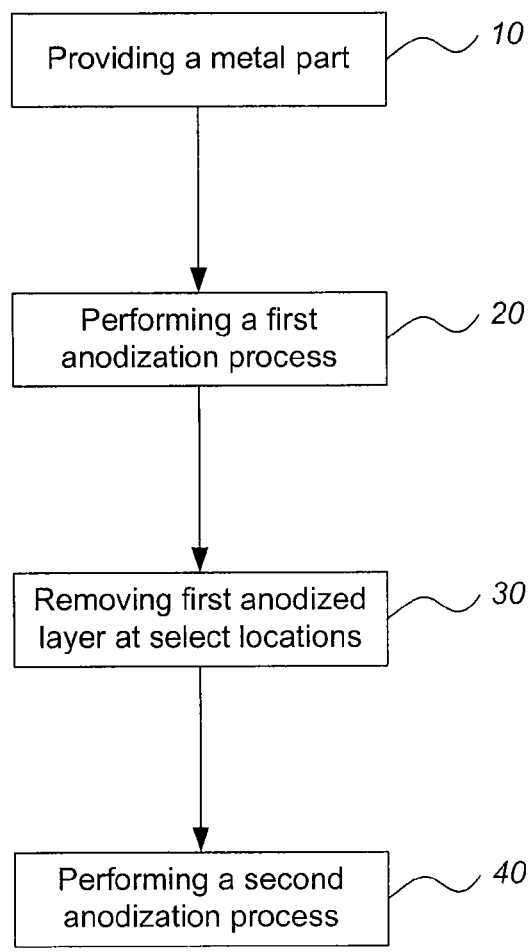
FIG. 1 is a flowchart of an exemplary method for treating a surface to obtain a dual anodization effect, in accordance with one embodiment of the present invention.

The present invention will be described with reference to the accompanying drawings, in which like reference numerals refer to similar elements. While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

A surface of a metal part or article may be treated to create dual anodized layers or regions having different properties. The two anodized layers may be different colors or may have different degrees of scratch or abrasion resistance. One anodized layer may be decorative in nature and the other anodized layer may be structural in nature. The dual anodized layers or regions may be applied to a broad range of metal articles including, electronic components, household appliances and cookware, automotive parts, and athletic equipment.

In one embodiment, the dual anodized layers or regions are created by performing a first anodization process on the surface of a metal part or article to create a first anodized layer, removing the first anodized layer at select locations, and performing a second anodization process to create a second anodized layer at the select locations. One of the first and second anodization processes may be a hard anodization process to create a hard anodized layer or region and the other of the first and second anodization processes may be a standard anodization process to create a standard anodized layer or region. The hard anodized layer or region may have different properties than the standard anodized layer or region. For example, the hard anodized layer or region may have a greater abrasion resistance than the standard anodized layer or region and/or the hard anodized layer or region may have a different color than the standard anodized layer or region.

In another embodiment, both the first and second anodization processes may include performing standard anodization such that both the first and second anodized layers are standard anodized layers. In this embodiment, the first and second anodized layers may have different colors.

FIG. 1 is a high level flowchart of an exemplary method for treating a surface of a metal article or part with a dual anodization process in order to create a surface with two distinct anodized layers or areas. The method may include a step 10 of providing a metal part or article followed by a step 20 of performing a first anodization process to produce a first anodized surface layer. Next, the method may include a step 30 of removing the first anodized surface layer at select locations. Subsequently, the method may include a step 40 of performing a second anodization process to produce a second anodized layer at the select locations where the first anodized surface layer was removed. The method may be applied to a broad range of metal articles including, but not limited to, electronic components, such as enclosures, shells, housings, or casings for electronic devices; household appliances and cookware, such as pots and pans; automotive parts; and athletic equipment, such as bikes.

The first and second anodized layers or regions may have different properties from one another. For example one anodized layer or region may be used for its decorative effects and the other anodized layer may be used for its structural effects. This may be accomplished by using different anodization processes for steps 20 and 40. For example one of steps 20 and 40 may use a standard anodization process and the other of steps 20 and 40 may use a hard anodization process. Standard anodizing and hard anodizing are terms of art. Standard anodizing refers to an anodization process using a sulfuric acid bath that is able to produce an oxide layer of up to about 25 microns ($\mu$m). Hard anodizing refers to an anodization process using a sulfuric acid bath maintained at about or slightly above the freezing point of water, for example in a range between about 0 and 5 degrees Celsius, to produce an oxide layer of up to about 100 microns. Standard anodized layers are generally a brighter color than hard anodized layers when dyed with the same solution, and when neither is dyed. Hard anodized layers, as the name connotes, are harder than standard anodized layers and therefore are more scratch and abrasion resistant. Accordingly, the first and second anodized layers or regions may have different scratch and abrasion resistance, or different colors, or both.

Figure 2:
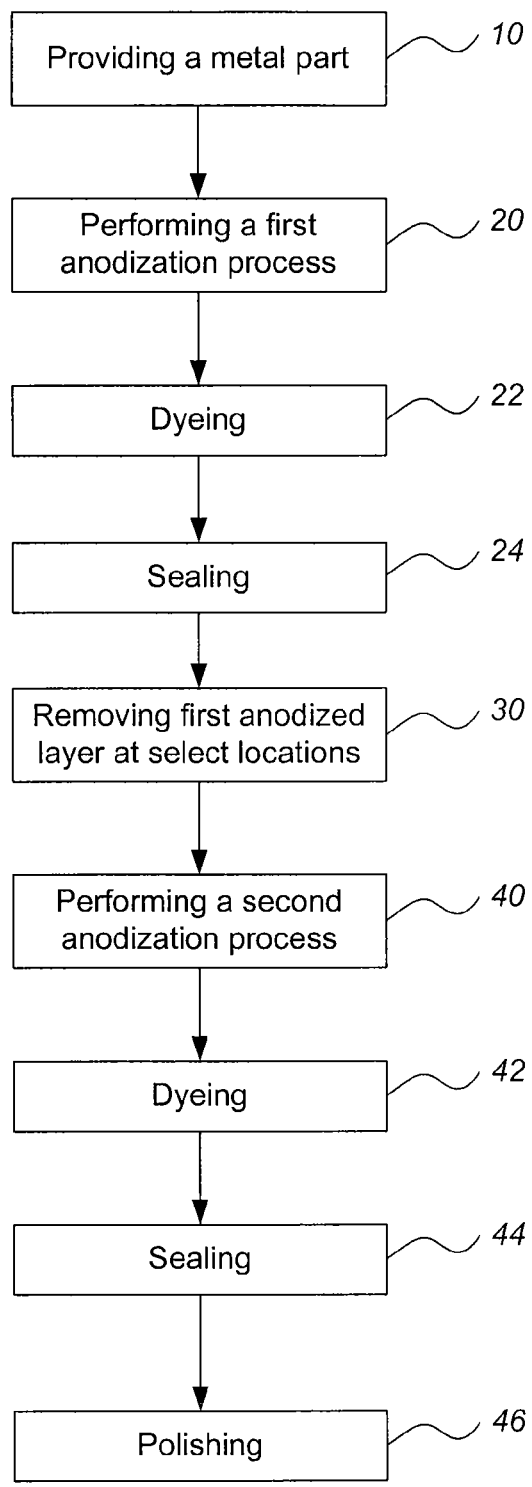
FIG. 2 is a flowchart of another embodiment for treating a surface to obtain a dual anodization effect, in accordance with one embodiment of the present invention.

FIG. 2 illustrates an flowchart of an exemplary method that is more detailed and adds additional steps to the flowchart of FIG. 1 between steps 20 and 30 and after step 40. For example, after step 20 of performing a first anodization process and before step 30 of removing selected areas of a first anodized surface layer, the method may include a step 22 of dyeing followed by a step 24 of sealing. After step 40 of performing a second anodization process, the method may include a step 42 of dyeing followed by a step 44 of sealing and then a step 46 of polishing. The details of each of the steps of FIG. 2 follows, along with a discussion of accompanying FIGS. 3-11, which illustrate views of a surface as the method outlined in FIG. 2 proceeds.

Figure 3:
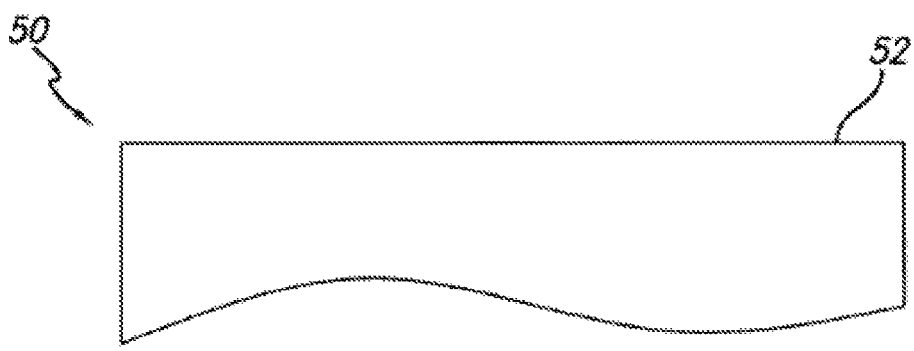
FIG. 3 is a cross-sectional side view of an article prior to being treated, in accordance with one embodiment of the present invention.

Referring to FIGS. 2 and 3, step 10 includes providing a metal part or article 50 as the raw material that is to be treated. Metal part 50 including each of its surfaces, may be formed using a variety of techniques, and may come in a variety of shapes, forms and materials. Examples of techniques include providing the metal part or article as a preformed sheet or extruding the metal part or article so that it is formed in a desired shape. A variety of metals and metal alloys may be treated, including, but not limited to aluminum, magnesium, titanium, and alloys thereof. Metal part or article 50 provided in step 10 may have a surface 52. In one example, metal part 50 may be extruded so metal part 50 is formed in a desired shape. Extrusion may be a process for producing a material in a desired shape in a continuous manner of indeterminate length so that the material may be subsequently cut to a desired length. In one example, metal part 50 may be formed from aluminum. In some embodiments, metal part 50 may be formed from extruded aluminum.

Figure 4:
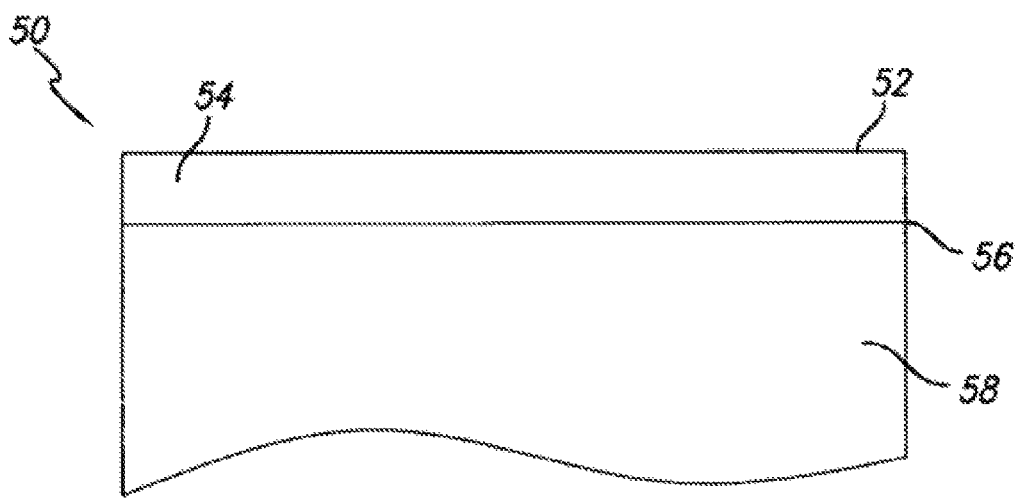
FIG. 4 is a cross-sectional side view of an article of FIG. 3 after a first anodization process, in accordance with one embodiment of the present invention.

In step 20, a first anodization process may be performed using standard anodization on surface 52 to create a standard anodized layer or area 54 of metal oxide, as shown in FIG. 4. Using standard anodization, is merely exemplary, and as discussed in more detail below, step 20 may include a hard anodization process instead. When standard anodized layer 54 is formed, a transition line 56 forms between standard anodized layer 54 and metal region 58 of metal part 50. Standard anodization may include placing metal part 50 in an electrolytic bath which may include sulfuric acid ($H_2SO_4$). The electrolytic bath may be maintained at about room temperature, for example the temperature may be in a range between about 18 and 22 degrees Celsius. Standard anodization may produce a standard anodized layer 54 of metal oxide having a thickness of up to about 25 microns. In some embodiments, the thickness of standard anodized layer 54 produced by standard anodization may be up to about 20 microns, or up to about 15 microns, or may be in a range between about 6 and 15 microns.

In step 22, metal part 50 may be dyed to impart a rich color to standard anodized layer 54. Standard anodized layer 54 formed during step 20 of anodizing, is porous in nature allowing standard anodized layer 54 to absorb a dye through its pores (not shown) to impart a rich color to standard anodized layer 54. The metal oxide of standard anodized layer 54 may also possess increased adherence capabilities for dyes than metal. The dyeing process may be accomplished through the typical method of dipping or immersing metal part 50 into a dye solution containing a dye which will impart a desired color to standard anodized layer 54. Color control may be achieved by measuring dyed standard anodized layer 54 with a spectrophotometer and comparing the value against an established standard.

Step 24 includes sealing the porous metal oxide of standard anodized layer 54 to seal the pores. The sealing process may include placing standard anodized layer 54 in a bath for a sufficient amount of time to create a sealant layer (not shown) that seals the pores (not shown) of standard anodized layer 54. The bath may be, for example, boiling water or a solution of nickel acetate. In some embodiments, step 22 of dyeing is optional, but step 24 of sealing may still occur.

Figure 5:
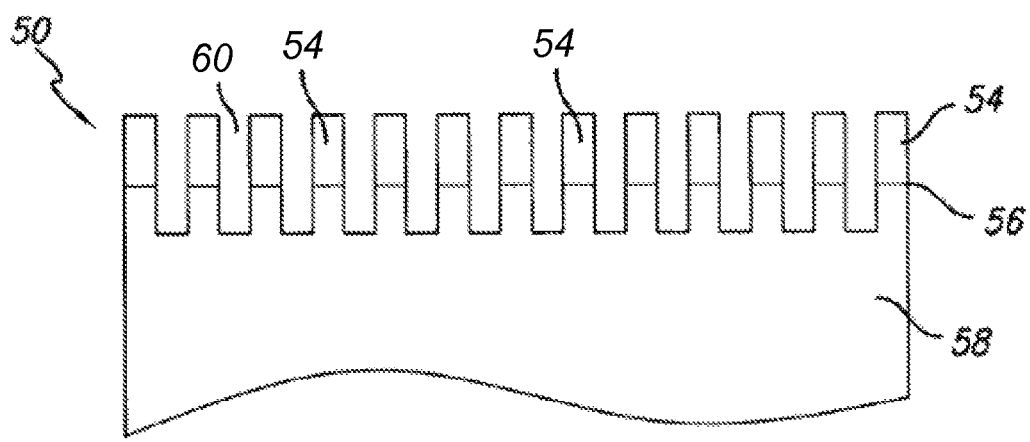
FIG. 5 is a cross-sectional side view of an article of FIG. 4 after a removal process, in accordance with one embodiment of the present invention.
Figure 6:
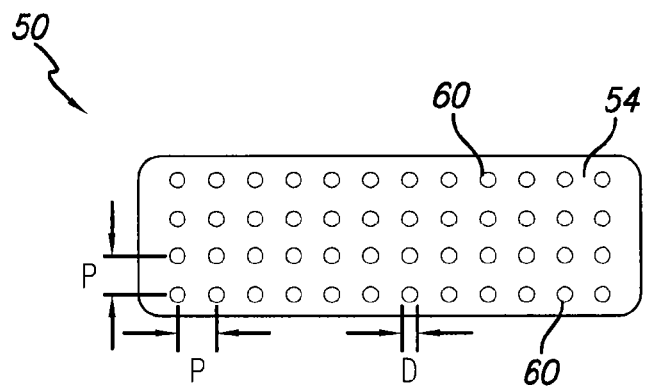
FIG. 6 is a top view of an article of FIG. 4 after a removal process, in accordance with one embodiment of the present invention.
Figure 7:
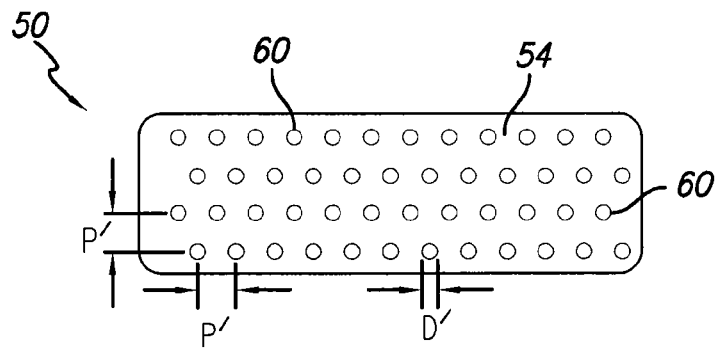
FIG. 7 is a top view of an article of FIG. 4 after a removal process, in accordance with one embodiment of the present invention.

In step 30, a selected area(s) or location(s) of standard anodized layer 54 are removed, as shown in FIGS. 5-7, where a second anodized layer will later be formed. Removed areas 60 may be formed in any desired pattern or shape that corresponds to the desired pattern and shape of the second anodized layer which will be formed later. For example, as shown in FIG. 6, removed areas 60 may be circular in shape and may be uniformly spaced apart in a regular pattern. Removed areas 60 may have a diameter D in a range between about 5 and 1,000 microns or about 50 and 100 microns. Removed areas 60 may also be spaced apart to have a pitch P in a range between about 10 microns and 5 mm or about 150 and 200 microns. In addition, as shown for example in FIG. 7, removed areas 60 may be applied in an irregular or random pattern. When removed areas 60 are in a random pattern they may still have a diameter D' in a range between about 5 and 1,000 microns or about 50 and 100 microns. Removed areas 60 may also be spaced apart to have a pitch P' in a range between about 10 microns and 5 mm or about 150 and 200 microns when arranged in an random pattern. The shape of removed areas 60 is merely exemplary and other shapes may be formed including, but not limited to, square, oval, elliptical, rectangular, hexagonal, and triangular. In some embodiments, removed areas 60 may be a curvy or zigzagged line. In addition, the size of the diameter of removed areas 60 and the pitch between removed areas 60 listed above are merely exemplary.

The process of step 30 removes an entire thickness of standard anodized layer 54 when forming removed areas 60 to expose metal region 58. The removal process may also remove a portion of metal region 58 in removed areas 60. In one embodiment, up to about 60 microns of metal region 58 may be removed from removed areas 60. Removing standard anodized layer 54 also removes the dye in removed areas 60.

In some embodiments, the removal process may be accomplished utilizing laser etching, wherein a laser is programmed to remove standard anodized layer 54 in a desired pattern to form removed areas 60. The laser may also be programmed to adjust the parameters of the laser etching, such as intensity and duration, to ensure removed areas 60 have a desired depth. Alternatively, in some embodiments, the removal process may include chemical etching, wherein a mask or photoresist, is applied to cover the areas of standard anodized layer 54 that are not to be etched. For example, standard anodized layer 54 may be covered with an ultraviolet (UV) curable coating. A sieve or screen with a desired pattern cut out corresponding to the areas of standard anodized layer 54 which are not to be removed is placed over standard anodized layer 54. A UV light is shined on the sieve or screen so that the UV light passes through the cut out pattern to cure the exposed coating. The coating covered by the sieve or screen remains uncured and is subsequently washed away leaving just the cured coating on standard anodized layer 54. This results in first anodized layer being exposed in a pattern corresponding to the pattern of removed area 60. The surface is then exposed to chemicals to etch away the exposed standard anodized layer 54 to form removed areas 60. The cured coating protects the remainder of standard anodized layer 54 from being etched and is removed after the chemical etching process. Laser etching and chemical etching are merely exemplary processes for removal step 30 and other processes included, but not limited to, machining may be utilized.

Figure 8:
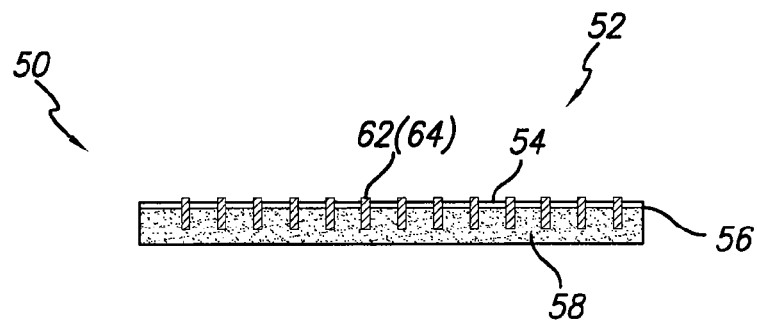
FIG. 8 is a cross-sectional side view of an article of FIG. 5 after a second anodization process, in accordance with one embodiment of the present invention.

In step 40, a second anodization process may be performed using hard anodization to form a hard anodization layer or area 62 in removed areas 60, as shown in FIG. 8. Using hard anodization, is merely exemplary, and as discussed in more detail below, step 40 may include a standard anodization process instead. Hard anodization may include placing metal part 50 in an electrolytic bath which may include sulfuric acid ($H_2SO_4$). The electrolytic bath may be maintained at or slightly above the freezing point of water, for example the temperature may be in a range between about 0 and 5 degrees Celsius. Hard anodization may include maintaining the electrolytic bath at a lower temperature than standard anodization and applying a greater amount of electric current to the electrolytic bath than standard anodization. Hard anodization may produce a hard anodized layer 62 of metal oxide having a thickness of up to about 100 microns. In some embodiments, the thickness of hard anodized layer 62 produced by standard anodization may be up to about 20 microns, or up to about 50 microns, or may be in a range between about 20 and 100 microns.

Figure 9:
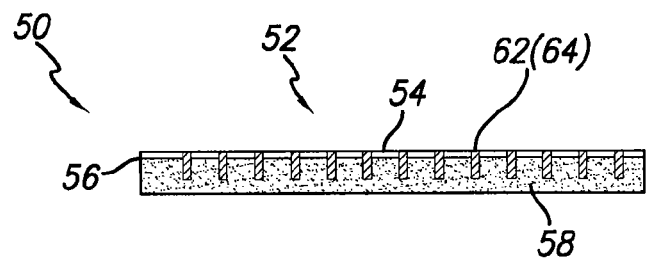
FIG. 9 is a cross-sectional side view of an article of FIG. 5 after a second anodization process, in accordance with another embodiment of the present invention.

In one embodiment, as shown in FIG. 8, hard anodized layer 62 may extend above standard anodized layer 54. For example, hard anodized layer 62 may extend above standard anodized layer 54 up to about 50 microns. This measurement is merely exemplary and hard anodized layer 62 may extend above standard anodized layer 54 by any amount as long as the strength of hard anodized layer 62 is maintained and does not easily break or crack. In another embodiment, as shown in FIG. 9, hard anodized layer 62 may be flush with standard anodized layer 54. The thickness of hard anodized layer 62 may be controlled by the length of time metal part 50 is in the electrolytic bath, which thereby controls the amount by which hard anodize layer 62 extends above standard anodized layer 54.

Figure 10:
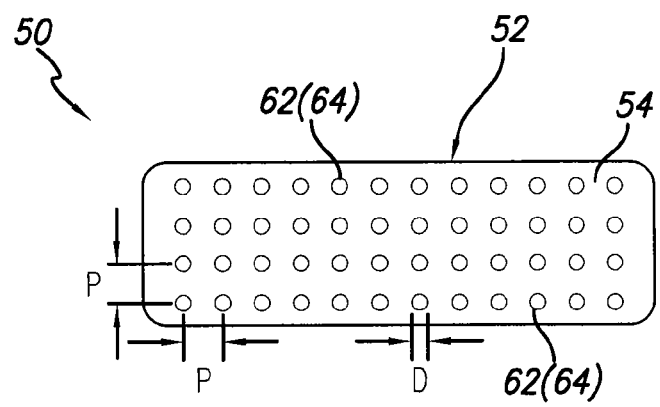
FIG. 10 is a top view of an article of FIG. 5 after a second anodization process, in accordance with the embodiment of FIG. 6.

Hard anodized layer 62 may be formed in any desired pattern or shape, as discussed above, and will correspond to the pattern and shape of removed areas 60. For example, as shown in FIG. 10, hard anodized layer 62 may form pins 64 that are circular in shape and may be uniformly spaced apart in a regular pattern. Pins 64 of hard anodized layer 62 may have a diameter D in a range between about 5 and 1,000 microns or about 50 and 100 microns. Pins 64 of hard anodized layer 62 may also be spaced apart to have a pitch P in a range between about 10 microns and 5 mm or about 150 and 200 microns. In addition, as shown for example in FIG. 11, pins 64 of hard anodized layer 62 may have an irregular or random pattern. When hard anodized layer 62 is in a random pattern, pins 64 may still have a diameter D' in a range between about 5 and 1,000 microns or about 50 and 100 microns. Pins 64 of hard anodized layer 62 may also be spaced apart to have a pitch P' in a range between about 10 microns and 5 mm or about 150 and 200 microns when arranged in an random pattern. The shape of hard anodized layer 62 is merely exemplary and other shapes may be formed including, but not limited to, square, oval, elliptical, rectangular, hexagonal, and triangular. In some embodiments, hard anodized layer 62 may be a curvy or zigzagged line. In addition, the size of the diameter of pins 64 of hard anodized layer 62 and the pitch between pins 64 of hard anodized layer 62 listed above are merely exemplary.

In step 42, hard anodized layer 62 is dyed, the process of which is similar to the process of step 22 and similar details will not be described in detail again. In some embodiments, hard anodized layer 62 may be dyed with the same dyeing solution as the standard anodized layer 54 as in step 22, however hard anodized layer 62 will have a slightly darker and duller color than standard anodized layer 54. In some embodiments, hard anodized layer 62 may be dyed with a different dyeing solution than the standard anodized layer 54 in step 22, thereby achieving a multi-color surface to metal part 50.

Step 44 may include sealing hard anodized layer 62, the process of which is similar to the process of step 44 and will not be described in detail again. In some embodiments, step 42 of dyeing is optional, but step 44 of sealing may still occur.

In step 46, surface 52 of metal part or article 50 may be polished to smooth surface 52. The polishing process of step 46 may also be utilized to control the distance hard anodized layer 62 extends above standard anodized layer 54, particularly when it is desired for hard anodized layer 62 to be flush with standard anodized layer 54. Exemplary polishing processes include, but are not limited to, lapping and buffing.

In describing the steps outlined in FIG. 2 above, step 20 of performing a first anodization process is described as a standard anodization process for creating standard anodized layer 54 and step 40 of performing a second anodization process is described as a hard anodization process for creating hard anodized layer 62. However, this is merely exemplary. In some embodiments, step 20 may be a hard anodization process that produces hard anodized layer 62 and step 40 may be a standard anodization process that produces standard anodized layer 54. Accordingly, hard anodized layer 62 may be formed before standard anodized layer 54. In such an instance, the other steps of FIG. 2 (22, 24, 30, 42, 44, and 46) are adjusted accordingly in order to produce treated metal part 50 as shown in FIGS. 8-11, depending upon whether hard anodized regions 62 extend above, or are flush with, standard anodized layer 54 and whether hard anodized regions 62 are arranged in a regular or irregular pattern. In other embodiments, both step 20 and step 40 may be standard anodization processes that form respective first and second standard anodized layers that are dyed separate colors.

Figure 11:
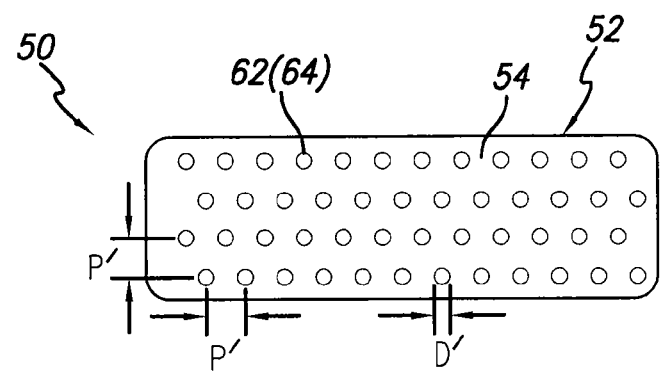
FIG. 11 is a top view of an article of FIG. 5 after a second anodization process, in accordance with the embodiment of FIG. 7.

As shown in FIGS. 8-11, metal part or article 50 with standard anodized layer 54 and hard anodized layer 62 provides a metal part 50 with the combined advantages of hard anodization and standard anodization. It is noted that while surface 52 of metal part or article 50 has a greater amount of standard anodized layer 54 than hard anodized layer 62, as shown in FIGS. 10 and 11, this is merely exemplary and surface 52 may have a greater amount of hard anodized layer 62 than standard anodized layer 54. Hard anodized layer 62 and standard anodized layer 54 will be distinct layers and will have different characteristics or properties, such as, for example differences in abrasion and scratch resistance, color, or both. Hard anodized layer 62 is useful for its structural properties as it provides a surface with increased abrasion and scratch resistance and standard anodized layer 54 is useful for its decorative properties as it provides a surface with an increased aesthetic appeal of bright, vibrant color. In addition, metal part or article 50 will have a multicolor or multishade effects because, as described above, hard anodized layer 62 and standard anodized layer 54 will have different colors. This may be accomplished by using a different dye in steps 22 and 42. Alternatively, as described above, if the same dye is utilized in steps 22 and 42, hard anodized layer 62 will have a darker duller appearance than standard anodized layer 54. Similarly, if steps 22 and 42 are skipped all together hard anodized layer 62 will have a darker duller appearance than standard anodized layer 54.

In some embodiments a multicolor or multishade effect may be accomplished without producing a hard anodized layer 62. For example, step 40 may also be a standard anodization process wherein a different dye is used in dyeing step 42 for the second anodized layer than in dyeing step 22 for the first anodized layer. In another embodiment, removal step 30 only removes a portion of standard anodized layer 54 in removed areas 60 wherein removed areas 60 have a lighter color than areas of standard anodized layer 54 that are not removed.

As previously noted, the ordering of steps discussed above, illustrated in the flowchart of FIG. 2 is for illustrative purposes and is merely exemplary. Accordingly, the steps may be varied. Not every step need be performed and additional steps may be included as would be apparent to one of ordinary skill in the art, including, but not limited rinsing surface metal part 50, degreasing metal part 50, activating anodized metal part 50, neutralizing metal part 50, or desmutting metal part 50, as necessary.

Figure 12:
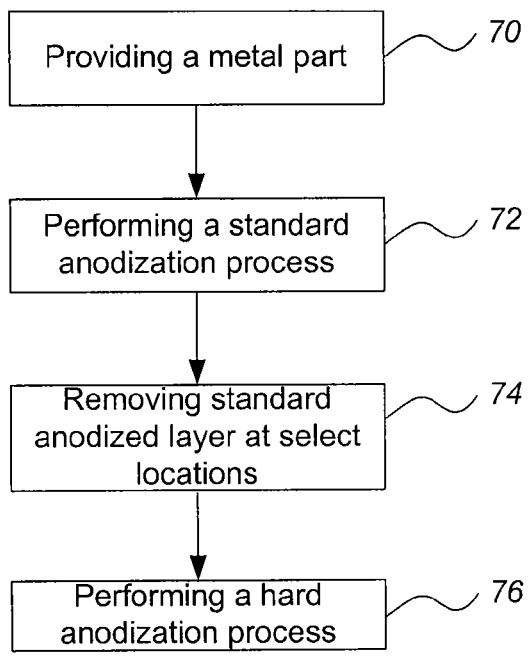
FIG. 12 is a flowchart of another embodiment for treating a surface to obtain a dual anodization effect, in accordance with one embodiment of the present invention.

In one embodiment, as shown for example in FIG. 12, a method for treating a surface of a metal article or part with a dual anodization process may include step 70 of providing a metal part. Step 70, may for example, correspond to step 10 shown in FIG. 2. Next, the method may include step 72 of performing a standard anodization process. Step 72 may, for example, correspond to step 20 shown in FIG. 2. Subsequently, the method may include step 74 of removing the standard anodized layer formed in step 72 at select locations. Step 74 may, for example, correspond to step 30 shown in FIG. 2. Finally, the method may include step 76 of performing a hard anodization process. Step 76 may, for example, correspond to step 40 shown in FIG. 2.

Figure 13:
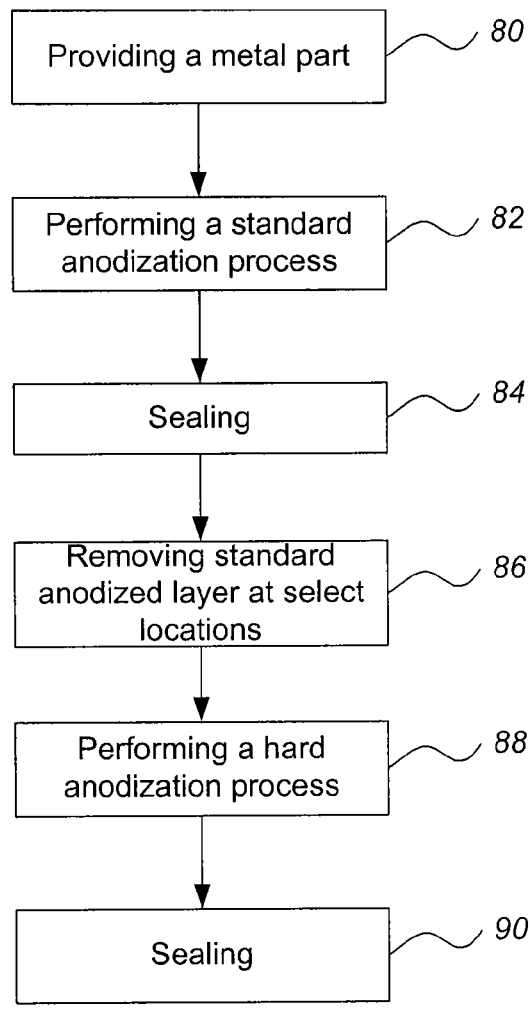
FIG. 13 is a flowchart of another embodiment for treating a surface to obtain a dual anodization effect, in accordance with one embodiment of the present invention.

In another embodiment, as shown for example in FIG. 13, a method for treating a surface of a metal article or part with a dual anodization process may include step 80 of providing a metal part. Step 80, may for example, correspond to step 10 shown in FIG. 2. Next, the method may include step 82 of performing a standard anodization process. Step 82 may, for example, correspond to step 20 shown in FIG. 2. Subsequently, the method may include step 84 of sealing the standard anodized layer formed in step 82. Step 84 may, for example, correspond to step 24 shown in FIG. 2. Next, the method may include step 86 of removing the sealed standard anodized layer at select locations. Step 86 may, for example, correspond to step 30 shown in FIG. 2. Subsequently, the method may include step 88 of performing a hard anodization process. Step 88 may, for example, correspond to step 40 shown in FIG. 2. Finally, the method may include step 90 of sealing the hard anodized layer formed in step 88. Step 90 may, for example, correspond to step 44 shown in FIG. 2.

In some embodiments, an anodization process between hard anodization and standard anodization may be utilized in place of a hard anodization process. In such an instance, the anodization process may have an electrolytic bath maintained at a temperature in a range between about 10 and 15 degrees Celsius. Such a process would produce an anodize layer which is has a color in between standard anodized layer 54 and hard anodized layer 62 and a scratch or abrasion resistance between standard anodized layer 54 and hard anodized layer 62.

The result of the surface treatments to metal part or article 50 is a surface 52 having two distinct anodized layers or regions with different properties. Creation of a hard anodized layer 62 and a standard anodized layer 54 results in surface 52 having a desired structural characteristic that protects the appearance of metal surface 52 (e.g., increased scratch and abrasion resistance) while also having a desired aesthetic characteristic (e.g., bright, vibrant color).

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

In addition, the breadth and scope of the present invention should not be limited by any of the above-described exemplary embodiments, but should be defined only in accordance with the following claims and their equivalents.

What is claimed is:

1. A metal enclosure of an electronic device, the metal enclosure comprising:
    a protective coating, comprising:
    a first metal oxide layer having a first outer surface and recesses, the recesses arranged in a pattern that is distributed within the protective coating, and
    a second metal oxide layer positioned within the recesses and having a second outer surface that is coplanar with the first outer surface, the second metal oxide layer characterized as having an abrasion resistance greater than an abrasion resistance of the first metal oxide layer, wherein the first outer surface and the second outer surface correspond to an exterior surface of the protective coating.

2. The metal enclosure of claim 1, wherein the an average pitch between the recesses ranges from about 10 micrometers and about 200 micrometers.

3. The metal enclosure of claim 1, wherein the second metal oxide layer is characterized as having a hardness greater than a hardness of the first metal oxide layer.

4. The metal enclosure of claim 3, wherein the second metal oxide layer has a greater thickness than the first metal oxide layer.

5. The metal enclosure of claim 1, wherein the first outer surface of the first metal oxide layer and the second outer surface of the second metal oxide layer are polished smooth.

6. The metal enclosure of claim 1, wherein the first metal oxide layer is characterized as having a first color and the second metal oxide layer is characterized as having a second color different than the first color.

7. The metal enclosure of claim 6, wherein the first color and the second color gives the protective coating a combined multi-shaded appearance.

8. The metal enclosure of claim 6, wherein the second color is darker than the first color.

9. The metal enclosure of claim 1, wherein the recesses are arranged in a random pattern.

10. The metal enclosure of claim 1, wherein each of the recesses has a circular cross-section.

* * * * *